United States Patent
Nakano et al.

(10) Patent No.: US 6,826,923 B2
(45) Date of Patent: Dec. 7, 2004

(54) COOLING DEVICE FOR SEMICONDUCTOR ELEMENTS

(75) Inventors: Masao Nakano, Shiga (JP); Hiromasa Ashitani, Otsu (JP); Masafumi Fukushima, Kusatsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/407,071

(22) Filed: Apr. 3, 2003

(65) Prior Publication Data

US 2003/0200762 A1 Oct. 30, 2003

(30) Foreign Application Priority Data

Apr. 25, 2002 (JP) ........................................ 2002-123990

(51) Int. Cl.[7] ................ F25D 23/12; F25D 17/02; H05K 7/20
(52) U.S. Cl. ............... 62/259.2; 62/434; 165/104.33; 361/699; 361/689
(58) Field of Search ................ 62/259.2, 434, 62/435, 132, 376, 64; 165/908, 104.33, 80.4; 361/699, 689, 698, 700

(56) References Cited

U.S. PATENT DOCUMENTS

| | | | |
|---|---|---|---|
| 5,133,492 A | * | 7/1992 | Wohrstein et al. ............ 225/2 |
| 5,203,399 A | * | 4/1993 | Koizumi ................ 165/104.33 |
| 5,349,831 A | | 9/1994 | Daikoku et al. |
| RE35,710 E | * | 1/1998 | Shinmura ................... 165/140 |
| 5,729,995 A | * | 3/1998 | Tajima ...................... 62/259.2 |
| 5,730,212 A | * | 3/1998 | Yamamoto et al. ......... 165/110 |
| 5,859,763 A | * | 1/1999 | Nam et al. .................. 361/699 |
| 6,158,232 A | * | 12/2000 | Tsuji et al. ................ 62/259.2 |
| 6,434,003 B1 | * | 8/2002 | Roy et al. .................... 361/699 |

FOREIGN PATENT DOCUMENTS

| | | | |
|---|---|---|---|
| JP | 01256775 A | * 10/1989 | ............ F25D/9/00 |
| JP | 6120382 | 4/1994 | |
| JP | 5136305 | 9/1994 | |
| JP | 2001349651 A | * 12/2001 | ............ F25D/9/00 |
| WO | WO 02/080270 A1 | * 10/2002 | ......... H01L/23/427 |

\* cited by examiner

*Primary Examiner*—Chen When Jiang
(74) *Attorney, Agent, or Firm*—RatnerPrestia

(57) ABSTRACT

A cooling device for cooling a semiconductor element includes at least one cold plate utilizing a copper plate for cooling a semiconductor element, a condenser utilizing a plurality of flat micro-tubes, a refrigerant pump for circulating a refrigerant, and a fan for cooling the condenser. The cold plate, the condenser, and the refrigerant pump are fluid connected to define a refrigerant circulating circuit.

7 Claims, 2 Drawing Sheets

COOLING DEVICE FOR SEMICONDUCTOR ELEMENTS

BACKGROUND OF THE INVENTION

1. Field of the Invention

The present invention relates generally to a cooling device for semiconductor elements that emit a substantial quantity of heat and, in particular but not exclusively, to a compact, easy to handle and efficient cooling device for cooling semiconductor elements by utilization of a change in phase between a liquid phase and a vapor phase of a refrigerant.

2. Description of the Related Art

It is well known that some of the semiconductor elements used in, for example, a computer emit a substantial quantity of heat as the computing speed thereof increases. A cooling device including a fan and a heat sink is generally utilized to cool the semiconductor elements. However, the capability of the air-cooling device to cool the semiconductor elements has now come to limitations.

In the case of a large scale computer, a relatively complicated cooling device is employed which includes a specially designed multi-layered ceramic wiring substrate and a housing mounted on the wiring substrate to define a cavity therein for accommodating a quantity of refrigerant, as disclosed in, for example, Japanese Laid-open Patent Publication No. 5-136305 published Jun. 1, 1993. The semiconductor elements are, while they are immersed in the refrigerant within the cavity, cooled in contact with the refrigerant. This cooling device dedicated for use with a large scale computer is indeed not suited for general use.

On the other hand, Japanese Laid-open Patent. Publication No. 6-120382 published Apr. 28, 1994 suggests a compact cooling device of a heat-pipe type operable by utilization of the phase change of a refrigerant used. This heat-pipe type cooling device would involve an increase in size and/or insufficient cooling performance particularly when it is used in cooling highly exothermic semiconductor elements.

In any event, the cooling device utilizing the fan and the heat sink is generally used in cooling elements that emit a relatively small quantity of heat.

With the conventional air-cooling device utilizing the fan and the heat sink, it is possible to construct a cooling device effective to cool semiconductor elements of about 70 W. When it comes to cooling of semiconductor elements of 150 W or higher, the cooling device tends to become extremely bulky or too bulky for it to be incorporated within a frame structure or the like. On the other hand, the system in which the semiconductor elements are immersed in the refrigerant such as disclosed in Japanese Laid-open Patent Publication No. 5-136305 discussed above, has a problem associated with the sealing properties of a vessel for accommodating the semiconductor elements to be cooled and also a problem associated with a storage capability and handing properties because of the cooling device complicated in structure.

SUMMARY OF THE INVENTION

In view of the foregoing, the present invention is devised to eliminate the problems hereinabove discussed and is intended to provide a compact cooling device capable of efficiently cooling highly exothermic semiconductor elements.

In accomplishing the above and other objectives, the present invention provides a cooling device for cooling a semiconductor element, which includes at least one cold plate utilizing a copper plate for cooling the semiconductor element, a condenser utilizing a plurality of flat micro-tubes, a refrigerant pump for circulating a refrigerant, and a fan for cooling the condenser. The cold plate, the condenser, and the refrigerant pump are fluid connected to define a refrigerant circulating circuit.

According to the present invention, the refrigerant condensed by the condenser is supplied by the refrigerant pump towards the cold plate which in turn cool the semiconductor element that is mounted on, or otherwise held in contact with the cold plate. Specifically, the cold plate with the refrigerant flowing therethrough absorbs heat emitted from the semiconductor element, causing the refrigerant to undergo a change in phase from a liquid refrigerant to a vapor refrigerant before it is returned to the condenser. The fan fitted to the condenser allows heat of the vapor refrigerant to be absorbed to cause the refrigerant to undergo a change in phase from the vapor refrigerant to the liquid refrigerant. The use of an efficient flat micro-tube condenser for the condenser and the use of an efficient copper plate for the cold plate make it possible to manufacture an efficient and compact cooling device.

In a preferred embodiment of the present invention, the plurality of flat micro-tubes are arranged such that a refrigerant supplied from the cold plate enters one of the flat micro-tubes positioned remote from the fan and emerges outwardly from another flat micro-tube positioned close to the fan. This allows a desirable temperature difference between the refrigerant and an air current induced by the fan to be efficiently obtained in each of the rows of the flat micro-tubes forming the condenser, resulting in highly efficient heat exchange.

Advantageously, an inlet through which the refrigerant enters the condenser is defined at a high position and an outlet through which the refrigerant emerges outwardly from the condenser is defined at a lower potion than the high position for the inlet. With this feature, the liquid refrigerant and the vapor refrigerant can be uniformly distributed to and flow through the plurality of flat micro-tubes, making it possible to maximize utilization of the flat micro-tube condenser. Since only the liquid refrigerant is discharged from the outlet of the condenser, not only can reduction of the flow, which would result from an entrapment of the gas by the refrigerant pump, be avoided, but a stable cooling performance can be also obtained.

It is preferred that a plurality of cold plates be employed which are fluid connected in series with each other. According to this feature, a plurality of semiconductor elements can be cooled in sequence determined by the order of arrangement of the cold plates and, hence, the semiconductor elements even though they emit different quantities of heat can satisfactorily be cooled, making it possible to suppress an undesirable increase of temperature of the semiconductor elements.

Conveniently, the cold plate has a plurality of fluid passages defined therein, all of which are fluid connected in series with each other by at least one copper tube for passage of the refrigerant therethrough. With this feature, the cold plate can be made merely by soldering the copper tube to the cold plate.

Alternatively, the cold plate may have a flat cavity defined therein, through which the refrigerant flow. With this feature, the surface area of contact of the refrigerant within the cavity with the copper plate can be increased, thus achieving highly efficient cooling.

BRIEF DESCRIPTION OF THE DRAWINGS

The above and other objectives and features of the present invention will become more apparent from the following description of a preferred embodiment thereof with reference to the accompanying drawings, throughout which like parts are designated by like reference numerals, and wherein.

DETAILED DESCRIPTION OF THE PREFERRED EMBODIMENTS

This application is based on an application No. 2002-123990 filed Apr. 25, 2002 in Japan, the content of which is herein expressly incorporated by reference in its entirety.

Figure 1:
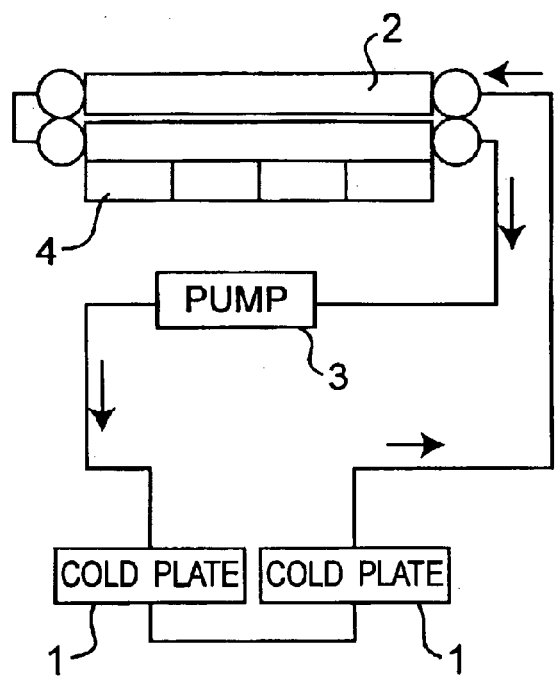
FIG. 1 is a schematic diagram showing a refrigerating cycle performed by a cooling device according to a preferred embodiment of the present invention.

Referring first to FIG. 1 showing a refrigerating cycle according to a preferred embodiment of the present invention, a cooling device shown therein includes a plurality of (for example, two) cold plates 1 in the form of a copper plate for cooling one or more highly exothermic semiconductor elements, that is, semiconductor elements tending to emit a substantial amount of heat when in operation, a flat micro-tube condenser 2, and a refrigerant pump 3, all connected in series with each other. The condenser 2 is adapted to be cooled by a fan 4, and a refrigerant is filled in the refrigerating cycle.

The cooling device is so designed that the refrigerant emerging first from the condenser 2 is supplied towards the cold plates 1 by the refrigerant pump 3. The cold plates 1 so supplied with the refrigerant absorb heat emitted from the highly exothermic semiconductor elements and, in the course of absorption of the heat, a change in phase from a liquid refrigerant to a vapor refrigerant takes place within the cold plates 1. The vapor refrigerant is then supplied towards the condenser 2 and cooled by the fan 4, resulting in a change in phase from the vapor refrigerant to the liquid refrigerant.

According to this embodiment, since cooling of the highly exothermic semiconductor elements is carried out by the utilization of the phase change of the refrigerant, a highly efficient cooling can be achieved.

Also, since the use has been made of the flat microtube condenser 2 and the cold plates 1 made of copper, an efficient heat exchange and heat transfer can be achieved and, hence, it is possible to manufacture the cooling device in a compact size.

The condenser 2 referred to above is made up of flat micro-tubes arranged in three rows and has a refrigerant inlet and a refrigerant outlet. The refrigerant inlet through which the refrigerant is introduced into the flat micro-tube condenser 2 is communicated with one of the flat micro-tubes that is positioned remote from the fan 4 whereas the refrigerant outlet from which the refrigerant is discharged outwardly of the flat micro-tube condenser 2 is communicated with another flat micro-tube that is positioned close to the fan 4. Accordingly, a current of air induced by the fan 4 and a temperature difference induced in the flat micro-tube condenser 2 can be effectively evolved due to the plural rows of the flat micro-tubes to thereby achieve a high performance heat exchange. Also, since the cold plates 1 are connected in series with each other and are each made of copper having a high heat conductivity, the semiconductor elements can be sufficiently cooled, even though they emit different quantities of heat, thereby suppressing any undesirable and/or abnormal increase of temperature of the semiconductor elements.

Although two cold plates 1 are illustrated in FIG. 1, only one cold plate may be employed.

Figure 2:
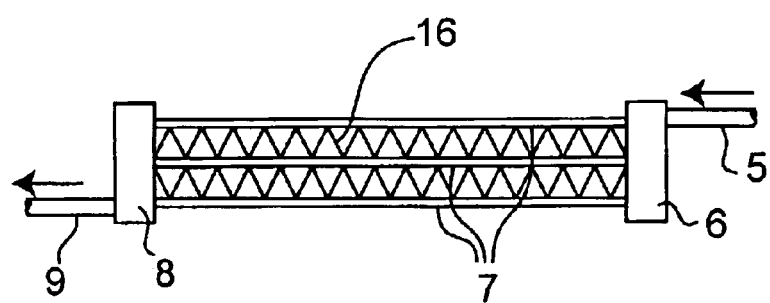
FIG. 2 is a schematic diagram showing the details of a flat micro-tube condenser used in the cooling device.

FIG. 2 illustrates the details of the flat micro-tube condenser 2. As shown therein, the flat micro-tube condenser 2 includes a refrigerant suction tube 5, fluid connected with an upper region of an inlet header 6, and a refrigerant discharge tube 9 fluid connected with a lower region of an outlet header 8. A plurality of (for example, three) flat micro-tubes 7 are disposed parallel to each other between the inlet and outlet headers 6 and 8, with a multiplicity of heat radiating fins 16 disposed between the neighboring flat micro-tubes 7. The flat micro-tube condenser 2 is of the structure in which a two-phase refrigerant, i.e., a mixture of the vapor refrigerant and the liquid refrigerant, which enters through the upper region of the inlet header 6, flows uniformly through those flat micro-tubes 7 and only the liquid refrigerant is subsequently discharged from the lower region of the outlet header 8. According to this embodiment, since the refrigerant can uniformly flow through the flat micro-tube condenser 2, utilization of the flat micro-tube condenser 2 can be effectively maximized, and since only the liquid refrigerant can be discharged from the outlet, not only can reduction of the flow, which would result from an entrapment of the gas by the refrigerant pump 4, be avoided, but a stable cooling performance can be also obtained.

Figure 3:
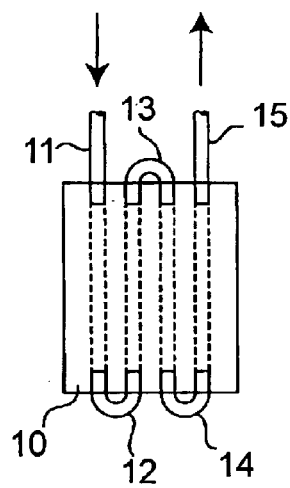
FIG. 3 is a schematic diagram showing the details of each of cold plates used in the cooling device.

FIG. 3 illustrates the details of each of the cold plates 1. The respective cold plate 1 includes a copper plate 10 having a plurality of parallel passages defined therein, with copper tubes 11 and 15 soldered thereto while generally U-shaped copper tubes 12, 13 and 14 are also soldered to the copper plate 10 so that a tortuous fluid passage can be defined in the cold plate 1. As such, the respective cold plate 1 can be assembled merely by soldering of the tubes to the copper plate 10 having the parallel passages defined therein.

Figure 4A:
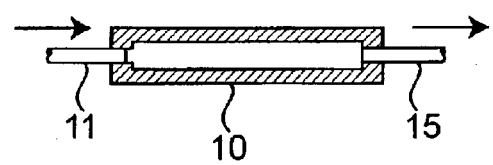
FIG. 4A is a sectional view of a modified form of each of the cold plates.
Figure 4B:
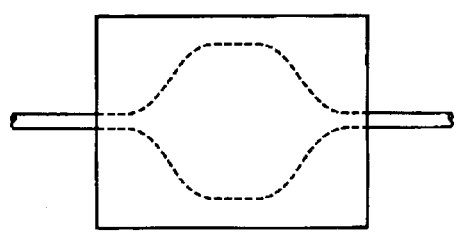
FIG. 4B is a top plan view of the cold plate of FIG. 4A.

FIGS. 4A and 4B illustrate a modified form of each of the cold plates 1 as viewed in a transverse sectional representation and a top plan representation, respectively. In this modification, the copper plate 10 has a flat cavity defined therein with refrigerant tubes 11 and 15 soldered thereto in communication with the cavity. This modified cold plate 1 is particularly advantageous in that since there is an increased surface area of contact of the refrigerant within the cavity with the copper plate 10, a highly efficient cooling can be achieved.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. A cooling device for cooling a semiconductor element, which comprises:

a first cold plate utilizing a copper plate for cooling the semiconductor element;

a condenser utilizing a plurality of flat micro-tubes;

a refrigerant pump for circulating a refrigerant, the first cold plate, the condenser and the refrigerant pump being connected in series in this order to define a refrigerant circulating circuit; and a fan for cooling the condenser, wherein the plurality of flat micro-tubes are arranged such that the refrigerant supplied from the first cold plate enters one of the flat micro-tubes positioned remote from the fan and emerges outwardly from another of the flat micro-tubes positioned close to the fan.

2. The cooling device according to claim 1, wherein an inlet through which the refrigerant enters the condenser is positioned higher than an outlet through which the refrigerant emerges outwardly from the condenser.

3. The cooling device according to claim 1, further comprising a second cold plate connected in series with the first cold plate.

4. The cooling device according to claim 1, wherein the first cold plate has a plurality of fluid passages defined therein, all of the fluid passages being connected in series with each other by at least one copper tube for passage of the refrigerant therethrough.

5. The cooling device according to claim 1, wherein the first cold plate has a flat cavity defined therein, through which the refrigerant flows.

6. A cooling device according to claim 1, said refrigerant circulating circuit including two-phase refrigerant which cools the semiconductor element.

7. A cooling device according to claim 1, wherein cooling of the semiconductor element is carried out by utilization of a phase change of the refrigerant.

* * * * *